(12) United States Patent
Poveda (10) Patent No.: US 7,820,494 B2
(45) Date of Patent: Oct. 26, 2010

(54) FORMING OF THE PERIPHERY OF A SCHOTTKY DIODE WITH MOS TRENCHES

(75) Inventor: Patrick Poveda, Villedomer (FR)

(73) Assignee: STMicroelectronics S.A., Montrouge (FR)

( * ) Notice: Subject to any disclaimer, the term of this patent is extended or adjusted under 35 U.S.C. 154(b) by 699 days.

(21) Appl. No.: 11/713,543

(22) Filed: Mar. 2, 2007

(65) Prior Publication Data
US 2007/0222018 A1    Sep. 27, 2007

Related U.S. Application Data

(63) Continuation of application No. 11/014,608, filed on Dec. 16, 2004, now abandoned.

(30) Foreign Application Priority Data

Dec. 18, 2003  (FR) .................................. 03 51110

(51) Int. Cl.
*H01L 21/338* (2006.01)
(52) U.S. Cl. ................. 438/138; 438/237; 257/E21.359
(58) Field of Classification Search ................. 438/48, 438/57, 92, 570–583, 237, 138; 257/E21.359
See application file for complete search history.

(56) References Cited

U.S. PATENT DOCUMENTS

| | | | |
|---|---|---|---|
| 4,982,260 A | 1/1991 | Chang et al. | |
| 6,309,929 B1 | 10/2001 | Hsu et al. | |
| 6,656,843 B2 * | 12/2003 | Bol | 438/694 |
| 6,740,951 B2 | 5/2004 | Tsui et al. | |
| 6,791,143 B2 | 9/2004 | Baliga | |
| 6,855,593 B2 * | 2/2005 | Andoh et al. | 438/237 |
| 2002/0074613 A1 | 6/2002 | Hshieh et al. | |
| 2003/0057482 A1 | 3/2003 | Harada | |
| 2005/0029614 A1 * | 2/2005 | Wu | 257/471 |

OTHER PUBLICATIONS

French Search Report from French Patent Application 03/51110, filed Dec. 18, 2003.
Mehrotra M. et al.: "The Trench MOS Barrier Schottky (TMBS) rectifier" Electron Devices Meeting, 1993. Technical Digest., International Washington, DC, USA Dec. 5-8, 1993, New York, NY, USA, IEEE, Dec. 5, 1993, pp. 675-678, XP010118313 ISBN: 0-7803-1450-6.

* cited by examiner

*Primary Examiner*—Steven J Fulk
(74) *Attorney, Agent, or Firm*—Lisa K. Jorgenson; James H. Morris; Wolf, Greenfield & Sacks, P.C.

(57) ABSTRACT

A method for forming a component of TMBS type having its periphery formed of a trench with insulated walls filled with a conductor, including the steps of depositing on a semiconductor substrate a thick layer of a first insulating material and a thin layer of a second material; simultaneously digging a peripheral trench and the trenches of the component; isotropically etching the first material so that a cap overhanging a recess remains; forming a thin insulating layer; and filling the trenches and said recess with a conductive material.

41 Claims, 7 Drawing Sheets

FORMING OF THE PERIPHERY OF A SCHOTTKY DIODE WITH MOS TRENCHES

CROSS REFERENCE TO RELATED APPLICATIONS

This application is a continuation of U.S. application Ser. No. 11/014,608, filed Dec. 16, 2004 entitled FORMING OF THE PERIPHERY OF A SCHOTTKY DIODE WITH MOS TRENCHES, which application is incorporated herein by reference in its entirety.

BACKGROUND OF THE INVENTION

1. Field of the Invention

To improve the reverse breakdown voltage of various components, especially of Schottky diodes, it has been provided to insert in a semiconductor layer forming one of the portions of the component conductive trenches insulated from this layer. Such so-called TMBS-type components as well as manufacturing processes thereof are described, for example, in article "The Trench MOS Barrier Schottky" by M. Mehrotra and B. J. Baliga in Electron Devices Meeting, 1993, Technical digest., International Washington D.C., USA Dec. 5-8, 1993, New-York, N.Y., USA, IEEE, Dec. 5, 1993, pages 675-678, XP010118313, ISBN 0780314506, as well as in U.S. Pat. No. 6,388,286 by B. J. Baliga. Both of these documents are incorporated herein by reference.

FIGS. 1A to 1G illustrate, in partial simplified cross-section view, different steps of the forming of a TMBS diodes according to a known method.

Figure 1A:
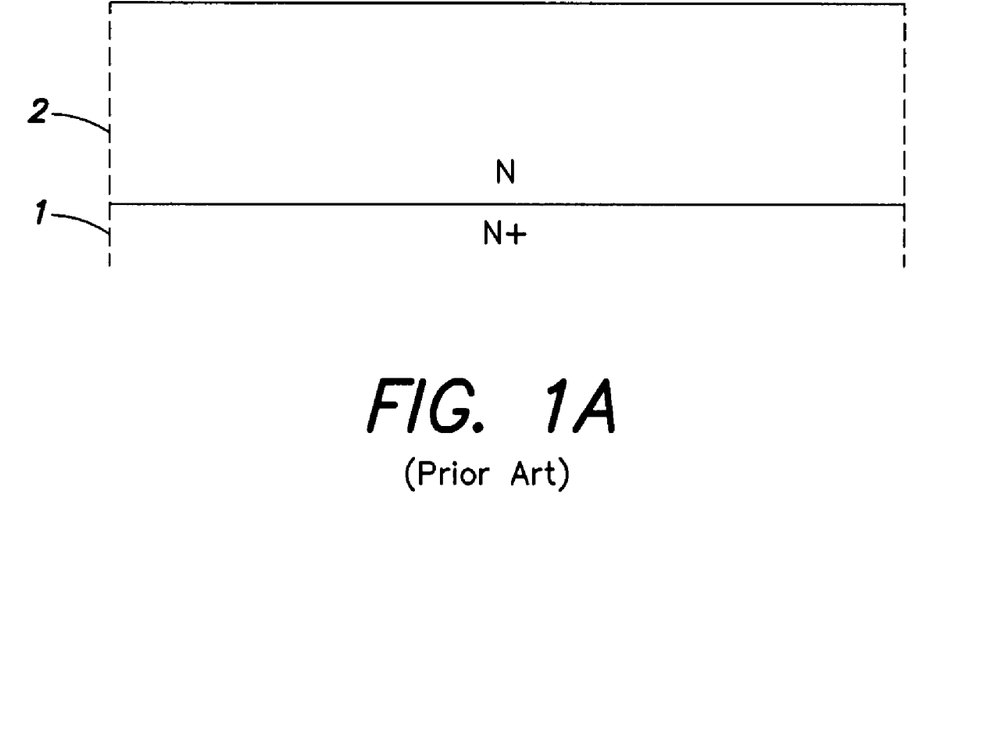
FIGS. 1A to 1G are partial simplified cross-section views which illustrate different steps of the forming of a Schottky diode according to a known method.

The forming of a TMBS Schottky diode starts with the forming, on a semiconductor substrate ($N^+$) 1 typically made of N-type heavily-doped single-crystal silicon, of a lightly-doped N-type single-crystal silicon layer 2.

Figure 1B:
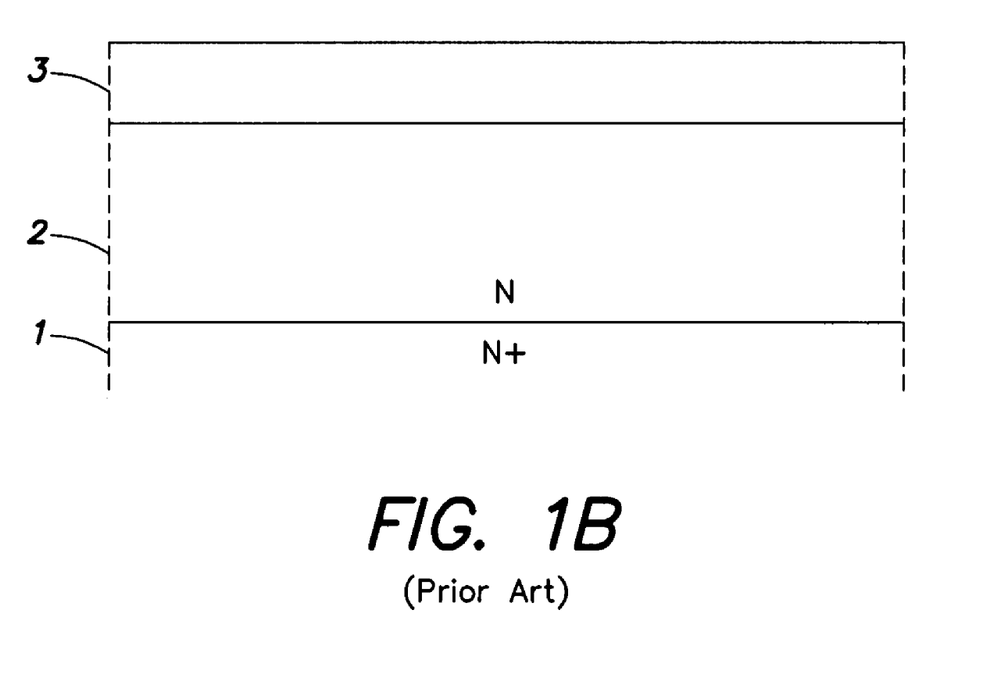

Then, as illustrated in FIG. 1B, a thick silicon oxide layer 3 ($SiO_2$) is formed on layer 2.

Figure 1C:
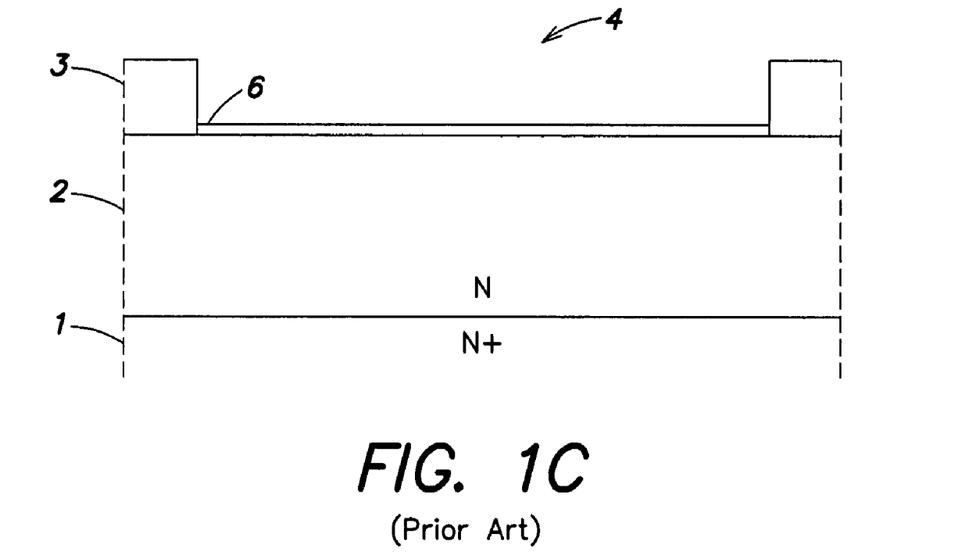

At the next steps, illustrated in FIG. 1C, a window 4 is opened in oxide layer 3 by means of a first mask, not shown, to partially expose silicon layer 2 in the region where the Schottky diode is to be formed. The remaining portion of oxide layer 3 will be called the field oxide hereafter. Then, a thin silicon oxide layer 6 intended to protect the surface of layer 2 in subsequent steps is formed at the bottom of window 4 on layer 2.

Figure 1D:
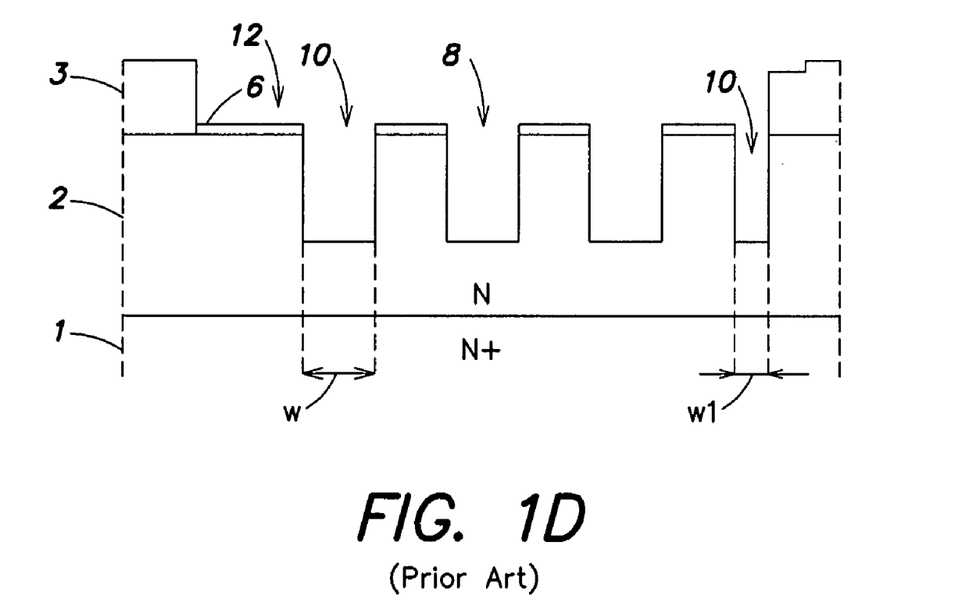

Then, as illustrated in FIG. 1D, trenches 8 of the component and a trench 10 peripheral to the component are simultaneously opened in window 4 by means of a second mask, not shown. Peripheral trench 10 enables giving the component a sufficient breakdown voltage.

Theoretically, the alignment of the second mask should be such that peripheral trench 10 follows the contour of field oxide 3. In practice, there inevitably exists a misalignment of the second mask with respect to the first mask, which translates as an offset of peripheral trench 10 with respect to field oxide 3. Two possible extreme defects have been shown in FIG. 1D. To the left of FIG. 1D, trench 10 exhibits a nominal maximum width W, but a wide portion 12 of layer 2 is maintained between the limit of field oxide 3 and peripheral trench 10. To the right of FIG. 1D, trench 10 exhibits a reduced width W1.

Figure 1E:
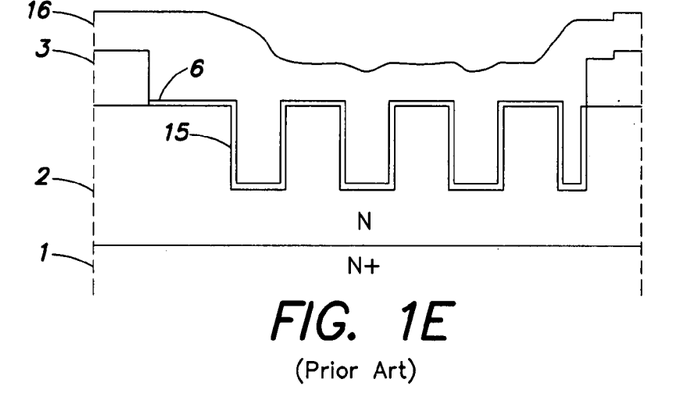

At the next steps, illustrated in FIG. 1E, a thin silicon oxide insulating layer 15 is formed at the bottom and on the walls of all trenches 8 and 10. Then, a polysilicon layer 16 is deposited to fill trenches 8 and 10. For this purpose, a polysilicon layer 16 having a thickness at least equal to half the nominal width of the trenches is deposited.

Figure 1F:
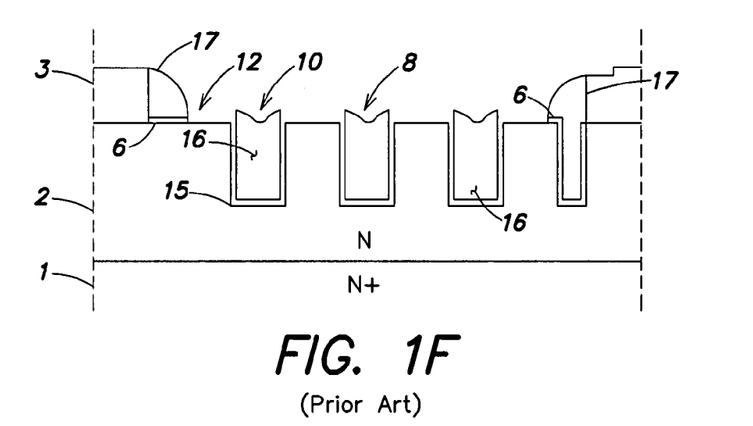

At the next step, illustrated in FIG. 1F, polysilicon 16 is etched to only be left in place in the trenches of component 8 and in peripheral trench 10. In this etching, a spacer 17 is left in place on the entire internal periphery of field oxide 3. After etching of the polysilicon, the exposed portions of oxide layer 6 are removed from the upper surface of silicon layer 2.

Figure 1G:
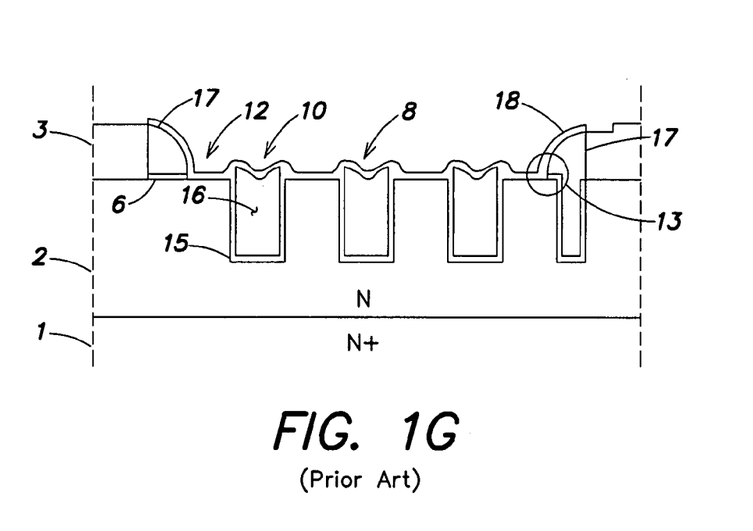

Then, as illustrated in FIG. 1G, a layer 18 of a material capable of forming a Schottky diode with the silicon forming the previously-exposed portions of the surface of layer 2 is deposited. For example, layer 18 is a metal silicide layer.

The method carries on with steps not shown of deposition and etch of a conductor in window 4 to form the diode anode.

The above-mentioned misalignment of the second mask with respect to the first mask may pose problems.

Thus, to the left of FIGS. 1F and 1G, spacer 17 does not reach peripheral trench 10. A portion of surface 12 of layer 2 comprised between field oxide 3 and peripheral trench 10 is then exposed by etching of insulating layer 6. A contact is then formed in unwanted fashion beyond peripheral trench 10, between this portion 12 and barrier layer 18. Peripheral trench 10 no longer plays its protection role and the device breakdown voltage is significantly reduced.

To the right of FIGS. 1F and 1G, in region 13, spacer 17 however extends beyond peripheral trench 10 and bears against layer 2. The junction between barrier layer 18 and layer 2 is then reduced with respect to its desired nominal dimension. The device still operates, but not with the desired performance.

SUMMARY OF THE INVENTION

The present invention aims at providing a method for manufacturing a TMBS component comprising insulated conductive trenches, among which a peripheral trench, which overcomes the previously-described disadvantages.

The present invention more specifically aims at providing a method for forming a Schottky diode which overcomes the disadvantages of known methods.

The present invention aims at providing such a method which enables simultaneously forming trenches of the component and a peripheral trench of the same width.

The present invention also aims at providing a periphery of a component comprising insulated conductive trenches which is an insulated conductive trench of uniform width.

To achieve these and other objects, the present invention provides a method for forming a component of TMBS type having its periphery formed of a trench with insulated walls filled with a conductor, comprising the steps of depositing, on a semiconductor substrate, a thick layer of a first insulating material; depositing a thin layer of a second material; simultaneously digging the peripheral trench and the trenches of the component into the stacking of the layers of the second and first materials as well as into an upper portion of the substrate; isotropically etching the first material to remove the portions of the thick layer of the first material between two trenches, whereby the thin layer of the second material only remains in place beyond the peripheral trench and forms a cap overhanging a recess; forming a thin insulating layer on the surface of the portions of the semiconductor layer exposed by the previous etch; depositing a layer of a conductive material to fill the trenches and said recess; and etching the layer of the conductive material and the underlying thin insulating layer to expose the surface of said semiconductor layer between two trenches and maintain the conductive material in the trenches and the recess.

According to an embodiment of the present invention, the layer of the first material is a silicon oxide layer of a thickness ranging between 0.8 and 1 μm.

According to an embodiment of the present invention, the layer of the second material is a silicon nitride layer of a thickness ranging between 100 and 200 nm.

According to an embodiment of the present invention, the thin insulating layer is a silicon oxide layer.

According to an embodiment of the present invention, the conductive material is doped polysilicon.

According to an embodiment of the present invention, the trenches have a width ranging between 0.5 and 2 μm and the interval between two trenches ranges between 0.5 and 2 μm.

According to an embodiment of the present invention, the layer of the conductive material deposited to fill the trenches and the recess has a thickness ranging between 0.8 and 1.2 μm.

The present invention also aims at a method for forming a Schottky diode, comprising the steps of forming a periphery according to the above-mentioned method, and forming a layer of a material capable of forming a Schottky junction with the semiconductor layer.

The present invention also aims at a periphery of a TMBS type component, the periphery being formed of a trench with insulated walls filled with a conductor. The trench forming the periphery exhibits a width which is uniform in transverse cross-section view and equal to the width of the component trenches, and is at a constant distance from an opening in a field oxide.

The foregoing objects, features, and advantages of the present invention will be discussed in detail in the following non-limiting description of specific embodiments in connection with the accompanying drawings.

DETAILED DESCRIPTION

For clarity, the same elements are designated with the same reference numerals in the different drawings and, further, as usual in the representation of integrated circuits, the various drawings are not to scale.

Figure 2A:
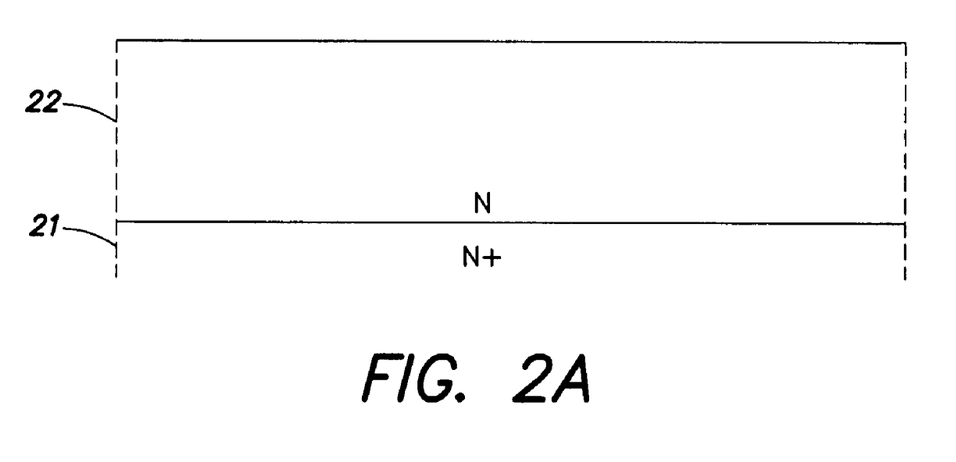
FIGS. 2A to 2H are partial simplified cross-section views which illustrate different steps of the forming of a Schottky diode according to an embodiment of the present invention.

As illustrated in FIG. 2A, the method according to the present invention starts with the forming, in a semiconductor substrate ($N^+$) 21, for example, made of single-crystal silicon, of a surface region 22 more lightly doped of the same type N as substrate 21. Layer 22, for example, results from an epitaxy.

Figure 2B:
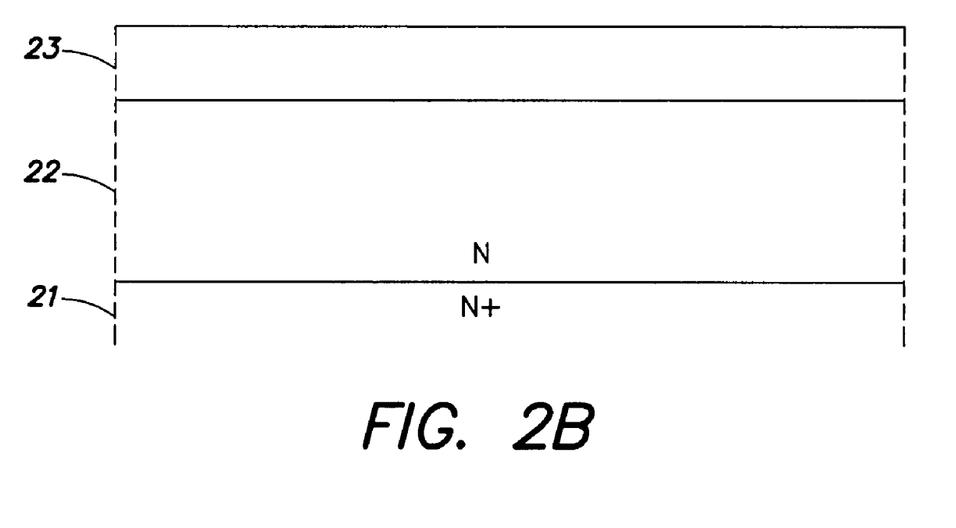

Then, as illustrated in FIG. 2B, a thick layer 23 of a material selectively etchable with respect to layer 22 is formed. For example, layer 23 is a silicon oxide layer having a thickness ranging between 0.8 and 1 μm.

Figure 2C:
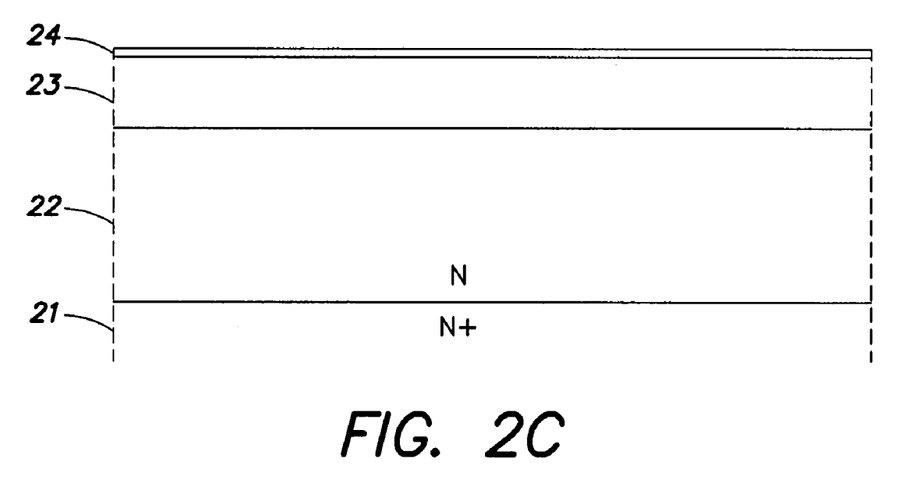

Then, as illustrated in FIG. 2C, a thin layer 24 of a material selectively etchable with respect to underlying layer 23 is deposited. For example, thin layer 24 is a silicon nitride layer having a thickness ranging between 100 and 200 nm.

Figure 2D:
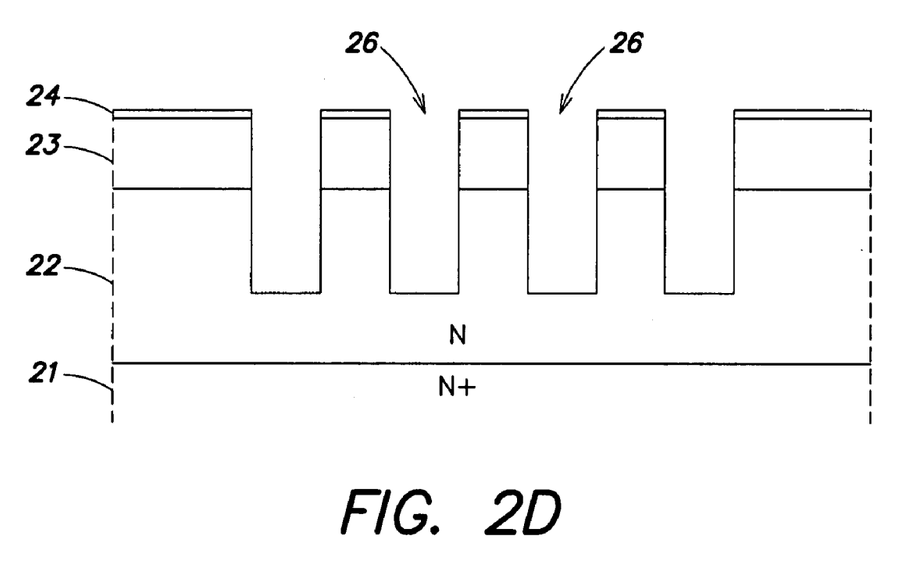

At the next steps, illustrated in FIG. 2D, the stacking of layers 24 and 23, as well as an upper portion of layer 22, are successively opened by means of the same mask to form trenches 26. Trenches 26 are uniform and all have the same width. Trenches 26 have a width from 0.5 to 2 μm and are separated by a width substantially equal to the width of a trench. The trenches are dug into layer 22 so that a portion of layer 22 is kept between the bottom of the trenches and substrate 21 underlying layer 22.

Figure 2E:
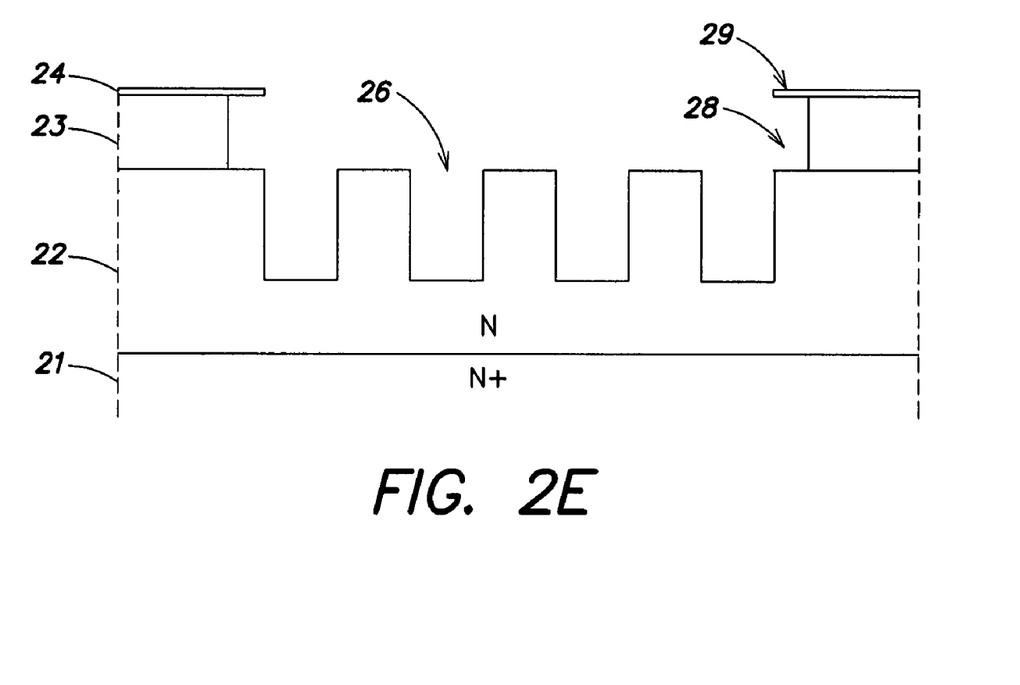

Then, as illustrated in FIG. 2E, the material forming thick layer 23 is isotropically etched. The etching is performed so that the portions of layer 23 separating layer 22 from layer 24 are removed between trenches 26. The corresponding superposed portions of layer 24 are then also removed. Layer 22 is then exposed between two trenches. At the periphery, layer 23 is etched under layer 24 forming a recess 28 with a depth on the order of half the interval separating two trenches 26. A cap 29 of layer 24 is formed.

Figure 2F:
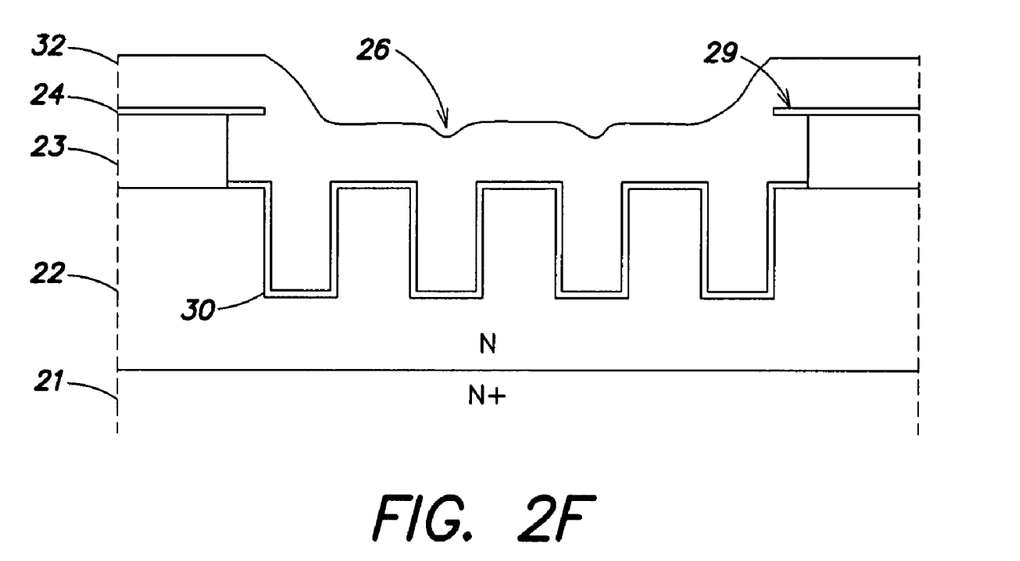

At the next steps, illustrated in FIG. 2F, a thin insulating layer 30 is formed on the exposed portions of layer 22, that is, on the walls and at the bottom of trenches 26 as well as between said trenches and in recess 28. Layer 30 results from the deposition of an insulator or a thermal oxidation of the silicon. Then, a conductive material 32, for example, polysilicon, selectively etchable with respect to insulator 30 and to layers 23 and 24, is deposited. Conductive material 32, for example, doped polysilicon, is deposited over a thickness at last equal to half the width of trenches 26 to ensure the complete filling thereof. It should be noted that the presence of cap 29 enables material 32 to fill recess 28 in the same way as it fills trenches 26.

Figure 2G:
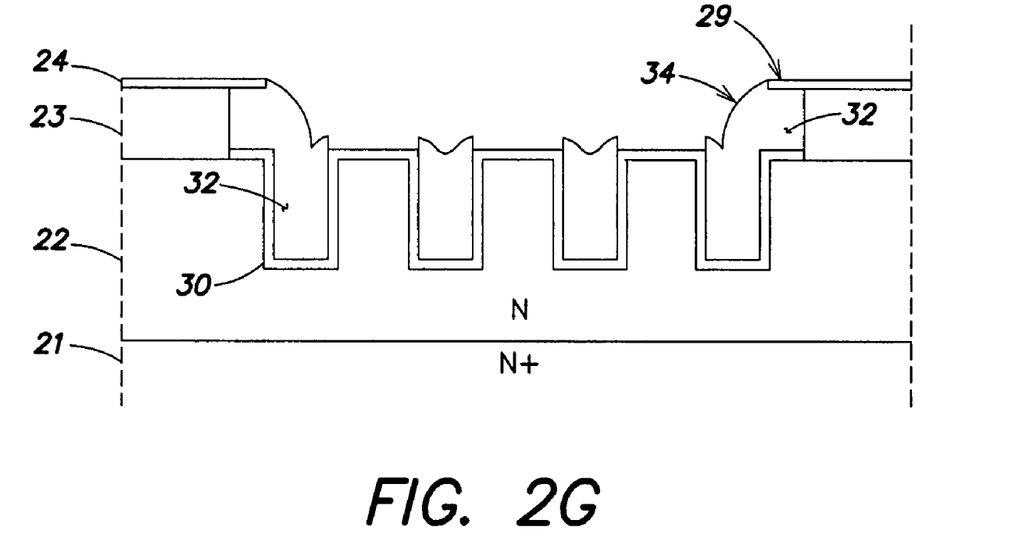

Then, as illustrated in FIG. 2G, layer 32 is etched to only be maintained in place in trenches 26 of FIG. 2E and to expose between two trenches insulating layer 30 which is in turn removed to partially expose layer 22 between two trenches.

In the anisotropic etch of the material forming layer 32, layer 24 is used as an etch stop. A spacer 34 which laterally bears on the portion of material 32 filling recess 28 of FIG. 2E is then formed at the periphery. Spacer 34 bears against the peripheral trench and does not extend beyond it. The presence of cap 29 results in that the peripheral portion of silicon layer 22 coated with insulating layer 30 is in sure fashion covered with spacer 34.

Figure 2H:
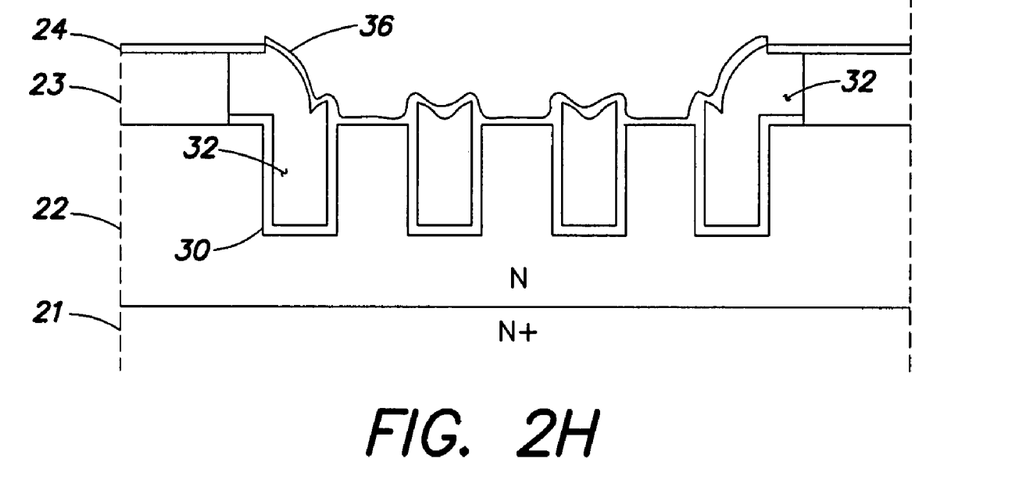

At the next step, illustrated in FIG. 2H, a layer 36 of a material capable of forming a Schottky junction with layer 22 is deposited. For example, layer 36 is a thin metal silicide layer.

An advantage of the present invention is to enable forming of trenches of uniform width of minimum dimensions. This enables reducing the silicon surface area taken up by the diode. This also enables simplifying the forming process by reducing to a minimum the peripheral trench width instead of widening it to overcome the above-mentioned misalignment risks.

Generally, the present invention advantageously enables obtaining structures of TMBS type which exhibit more homogeneous electric characteristics than known structures.

Of course, the present invention is likely to have various alterations, modifications, and improvements which will readily occur to those skilled in the art. In particular, it will be within the abilities of those skilled in the art to adapt the materials to a considered technological process. In particular, layer 24 used as a self-alignment and etch mask of material 32 may be chosen to be of any appropriate material, provided that it is selectively etchable with respect to underlying layer 23 and that its presence has no incidence upon the subsequent steps such as the forming of thin insulating layer 30 (FIG. 2F).

Similarly, it has been previously considered that trenches 26 are dug so that a portion of layer 22 is maintained in place at the bottom of the trenches. However, the trenches could extend to reach substrate 21.

Further, it will be within the abilities of those skilled in the art to adapt the doping levels of layer 22 and of substrate 21 to the desired electric performance. Similarly, it will be within the abilities of those skilled in the art to dope in any appropriate fashion the polysilicon used as conductive material 32 for filling trenches 26. It should be noted that "substrate" is used to designate a uniformly-doped silicon trench as well as epitaxial areas and/or areas specifically doped by diffusion/implantation formed on or in a solid substrate.

Generally, although the present invention has been described in the context of a silicon process, it applies to any semiconductor circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a component of TMBS type having its periphery formed of a trench with insulated walls filled with a conductor, comprising the steps of:
    depositing on a semiconductor substrate a thick layer of a first insulating material;
    depositing a thin layer of a second material;
    simultaneously digging the peripheral trench and the trenches of the component into the stacking of layers of second and first materials as well as into an upper portion of the substrate, all the trenches having a same width;
    isotropically etching the first material to remove the portions of the thick layer of the first material between two trenches, whereby the thin layer of the second material only remains in place beyond the peripheral trench and forms a cap overhanging a recess;
    forming a thin insulating layer on the surface of the portions of the semiconductor layer exposed by the etching step;
    depositing a layer of a conductive material to fill the trenches and said recess; and
    etching the layer of the conductive material and the underlying thin insulating layer to expose the surface of said semiconductor layer between two trenches and maintain the conductive material in the trenches and said recess.

2. The method of claim 1, wherein the layer of the first material is a silicon oxide layer of a thickness ranging between 0.8 and 1 µm.

3. The method of claim 1, wherein the layer of the second material is a silicon nitride layer of a thickness ranging between 100 and 200 nm.

4. The method of claim 1, wherein the thin insulating layer is a silicon oxide layer.

5. The method of claim 1, wherein the conductive material is doped polysilicon.

6. The method of claim 1, wherein the trenches have a width ranging between 0.5 and 2 µm and the interval between two trenches ranges between 0.5 and 2 µm.

7. The method of claim 6, wherein the layer of the conductive material deposited to fill the trenches and the recess has a thickness ranging between 0.8 and 1.2 µm.

8. A method for forming a Schottky diode, comprising:
    forming a periphery according to claim 1; and
    forming a layer of a material capable of forming a Schottky junction with the semiconductor layer.

9. A method for manufacturing an integrated circuit comprising:
    providing a semiconductor substrate;
    forming a semiconductor region disposed adjacent to the semiconductor substrate;
    forming a relatively thick material on the semiconductor region;
    forming a relatively thin material on the relatively thick material;
    forming a plurality of trenches in the semiconductor region, the plurality of trenches comprising all of the trenches in the semiconductor region, each trench being substantially equal in width;
    etching the relatively thick material to remove portions of both the relatively thick material and the relatively thin material such that the relatively thin material forms a cap overhanging a recess;
    depositing a conductive material that fills the plurality of trenches and the recess; and
    processing the circuit further to form the integrated circuit.

10. The method of claim 9, wherein forming a relatively thick material on the semiconductor region comprises forming silicon oxide on the semiconductor region.

11. The method of claim 9, wherein forming a relatively thick material on the semiconductor region comprises forming the relatively thick material to a thickness ranging between approximately 0.8 µm and approximately 1 µm.

12. The method of claim 9, wherein forming a relatively thin material on the relatively thick material comprises forming silicon nitride on the relatively thick material.

13. The method of claim 9, wherein forming a relatively thin material on the relatively thick material comprises forming the relatively thin material to a thickness ranging between approximately 100 nm and approximately 200 nm.

14. The method of claim 9, wherein simultaneously forming a plurality of trenches in the semiconductor region comprises removing material from the relatively thin material, the relatively thick material, and the semiconductor region.

15. The method of claim 9, wherein forming a plurality of trenches in the semiconductor region comprises forming trenches of uniform separation.

16. The method of claim 9, wherein processing the circuit further comprises removing portions of the relatively thick and relatively thin material between the trenches.

17. The method of claim 16, wherein removing portions of the relatively thick and relatively thin material between the trenches comprises forming a recess region.

18. The method of claim 17, wherein forming a recess region comprises forming a cap that overhangs the recess region.

19. The method of claim 9, wherein processing the circuit further comprises forming a silicon oxide layer as an insulating layer.

20. The method of claim 19, wherein forming a silicon oxide layer comprises depositing a conductive material on the silicon oxide layer.

21. The method of claim 20, wherein depositing a conductive material on the silicon oxide layer comprises substantially completely filling the trenches.

22. The method of claim 20, wherein depositing a conductive material on the silicon oxide layer comprises depositing the conductive material to a thickness ranging between approximately 0.8 µm and approximately 1.2 µm.

23. The method of claim 22, wherein depositing the conductive material comprises depositing a conductive layer on the conductive material to form a Schottky junction with the semiconductor region.

24. The method of claim 23, wherein depositing the conductive layer on the conductive material comprises depositing metal silicide.

25. A method for manufacturing an integrated circuit comprising:

providing a semiconductor substrate;

forming a semiconductor region disposed adjacent to the semiconductor substrate;

forming a relatively thick material on the semiconductor region;

forming a relatively thin material on the relatively thick material;

simultaneously forming a peripheral trench and a plurality of component trenches into the relatively thin and relatively thick materials and into an upper portion of the semiconductor region;

etching the relatively thick material to remove portions of both the relatively thick material and the relatively thin material such that the relatively thin material forms a cap overhanging a recess;

depositing a conductive material that fills the plurality of trenches and the recess; and processing the circuit further to form the integrated circuit.

26. The method of claim 25, wherein forming a relatively thick material on the semiconductor region comprises forming silicon oxide on the semiconductor region.

27. The method of claim 25, wherein forming a relatively thick material on the semiconductor region comprises forming the relatively thick material to a thickness ranging between approximately 0.8 μm and approximately 1 μm.

28. The method of claim 25, wherein forming a relatively thin material on the relatively thick material comprises forming silicon nitride on the relatively thick material.

29. The method of claim 25, wherein forming a relatively thin material on the relatively thick material comprises forming the relatively thin material to a thickness ranging between approximately 100 nm and approximately 200 nm.

30. The method of claim 25, wherein simultaneously forming a peripheral trench and a plurality of component trenches in the semiconductor region comprises removing material from the relatively thin material, the relatively thick material, and the semiconductor region.

31. The method of claim 25, wherein simultaneously forming a peripheral trench and a plurality of component trenches in the semiconductor region comprises forming trenches of substantially equal separation.

32. The method of claim 25, wherein simultaneously forming a peripheral trench and a plurality of component trenches in the semiconductor region comprises forming trenches of substantially equal width.

33. The method of claim 25, wherein processing the circuit further comprises removing portions of the relatively thick and relatively thin material between the peripheral trench and the plurality of component trenches.

34. The method of claim 33, wherein removing portions of the relatively thick and relatively thin material comprises forming a recess region.

35. The method of claim 34, wherein forming a recess region comprises forming a cap that overhangs the recess region.

36. The method of claim 25, wherein processing the circuit further comprises forming a silicon oxide layer as an insulating layer.

37. The method of claim 36, wherein forming a silicon oxide layer comprises depositing a conductive material on the silicon oxide layer.

38. The method of claim 37, wherein depositing a conductive material on the silicon oxide layer comprises substantially completely filling the peripheral trench and the plurality of component trenches.

39. The method of claim 37, wherein depositing a conductive material on the silicon oxide layer comprises depositing a conductive material to a thickness ranging between approximately 0.8 μm and approximately 1.2 μm.

40. The method of claim 39, wherein depositing the conductive material comprises depositing a conductive layer on the conductive material to form a Schottky junction with the semiconductor region.

41. The method of claim 40, wherein depositing the conductive layer on the conductive material comprises depositing metal silicide.

* * * * *